(12) United States Patent
Ishii et al.

(10) Patent No.: US 10,854,473 B2
(45) Date of Patent: Dec. 1, 2020

(54) POLISHING METHOD, POLISHING APPARATUS, AND SUBSTRATE PROCESSING SYSTEM

(71) Applicant: EBARA CORPORATION, Tokyo (JP)

(72) Inventors: Yu Ishii, Tokyo (JP); Kenya Ito, Tokyo (JP); Keisuke Uchiyama, Tokyo (JP); Masayuki Nakanishi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 302 days.

(21) Appl. No.: 15/909,758

(22) Filed: Mar. 1, 2018

(65) Prior Publication Data

US 2018/0254196 A1    Sep. 6, 2018

(30) Foreign Application Priority Data

Mar. 6, 2017 (JP) .................................. 2017- 42131

(51) Int. Cl.
```
H01L 21/461   (2006.01)
H01L 21/68    (2006.01)
B24B 37/10    (2012.01)
B24B 37/005   (2012.01)
G06F 9/06     (2006.01)
H01L 21/02    (2006.01)
```

(52) U.S. Cl.
CPC .......... *H01L 21/461* (2013.01); *B24B 37/005* (2013.01); *B24B 37/107* (2013.01); *G06F 9/06* (2013.01); *H01L 21/02096* (2013.01); *H01L 21/68* (2013.01)

(58) Field of Classification Search
CPC . H01L 21/461; H01L 21/02096; H01L 21/68; B24B 37/005; G06F 9/06
See application file for complete search history.

(56) References Cited

U.S. PATENT DOCUMENTS

| | | | |
|---|---|---|---|
| 6,712,678 B1* | 3/2004 | Wada ................... | B24B 53/017 451/285 |
| 8,360,817 B2* | 1/2013 | Ishii ....................... | B24B 49/00 451/5 |
| 10,170,344 B2* | 1/2019 | Ishibashi ........... | H01L 21/67046 |
| 10,192,757 B2* | 1/2019 | Ishibashi ........... | H01L 21/67051 |
| 2007/0293047 A1* | 12/2007 | Fukushima ............ | B24B 37/04 438/692 |
| 2013/0213437 A1 | 8/2013 | Ishii et al. | |
| 2015/0000056 A1* | 1/2015 | Togawa ............ | H01L 21/67051 15/102 |

FOREIGN PATENT DOCUMENTS

| | | |
|---|---|---|
| JP | 2002-343754 A | 11/2002 |
| JP | 2014-150178 A | 8/2014 |
| JP | 2014-220495 A | 11/2014 |
| JP | 2015-012200 A | 1/2015 |
| JP | 2016-058724 A | 4/2016 |

\* cited by examiner

*Primary Examiner* — Dung Van Nguyen
(74) *Attorney, Agent, or Firm* — BakerHostetler

(57) ABSTRACT

A polishing method capable of polishing a substrate, such as a wafer, with low running costs is disclosed. A polishing method includes: rotating a substrate while holding a backside surface of the substrate with a vacuum suction stage; rotating a polishing head holding a plurality of polishing tools; and polishing a front-side surface of the substrate by pressing the plurality of polishing tools, which are rotating, against the front-side surface of the substrate. The front-side surface is a surface on which interconnect patterns are to be formed.

17 Claims, 16 Drawing Sheets

POLISHING METHOD, POLISHING APPARATUS, AND SUBSTRATE PROCESSING SYSTEM

CROSS REFERENCE TO RELATED APPLICATION

This document claims priority to Japanese Patent Application Number 2017-42131 filed Mar. 6, 2017, the entire contents of which are hereby incorporated by reference.

BACKGROUND

In NIL (Nanoimprint Lithography), circuit patterns are directly transferred from a template to a wafer. If fine protrusions, such as particles, exist on a surface of the wafer, the template can be broken when the circuit patterns are transferred. Thus, in order to increase a service life of the expensive template, it is necessary to remove such fine protrusions from the wafer before transferring of the circuit patterns. The fine protrusions existing on the surface of the wafer include not only particles adhering to the wafer surface, but also foreign matters embedded in a film. In particular, it is difficult to remove such foreign matters with a cleaning mechanism, like sponge scrubbing.

Use of a chemical mechanical polishing (CMP) apparatus is one possible solution for removing the fine protrusions from the wafer surface. The CMP apparatus is configured to bring a wafer into sliding contact with a polishing pad on a polishing table while supplying slurry onto the polishing pad to thereby polish the surface of the wafer.

However, the CMP apparatus is a large device having the polishing table whose diameter is more than twice that of the wafer, and therefore requires a large installation space. In addition, the CMP apparatus entails consumables including the slurry and the polishing pad, which increase costs. Moreover, in order to prevent contamination of the wafer surface, it is necessary to sufficiently clean the polished surface of the wafer so as to remove the slurry from the wafer.

SUMMARY OF THE INVENTION

According to embodiments, there are provided a polishing method and a polishing apparatus capable of polishing a substrate, such as a wafer, with low running costs. In addition, according to an embodiment, there is provided a substrate processing system including such a polishing apparatus.

Embodiments, which will be described below, relate to a method and an apparatus for polishing a substrate, such as a wafer, and more particularly to a method and an apparatus for polishing a front-side surface of a substrate on which interconnect patterns are to be formed.

In an embodiment, there is provided a polishing method comprising: rotating a substrate while holding a back-side surface of the substrate with a vacuum suction stage; rotating a polishing head holding a plurality of polishing tools; and polishing a front-side surface of the substrate by pressing the plurality of polishing tools, which are rotating, against the front-side surface of the substrate, the front-side surface being a surface on which interconnect patterns are to be formed.

In an embodiment, pressing the plurality of polishing tools, which are rotating, against the front-side surface of the substrate comprises pressing the plurality of polishing tools, which are rotating, against the front-side surface of the substrate while oscillating the polishing head parallel to the front-side surface of the substrate.

In an embodiment, oscillating the polishing head parallel to the front-side surface of the substrate comprises oscillating the polishing head between a central portion and an outer portion of the front-side surface of the substrate in directions parallel to the front-side surface of the substrate.

In an embodiment, pressing the plurality of polishing tools, which are rotating, against the front-side surface of the substrate comprises pressing the plurality of polishing tools, which are rotating, against the front-side surface of the substrate while supplying a liquid onto the front-side surface of the substrate, the liquid containing no abrasive grains therein.

In an embodiment, the liquid is jetted approximately parallel to the front-side surface of the substrate.

In an embodiment, pressing the plurality of polishing tools, which are rotating, against the front-side surface of the substrate comprises pressing the plurality of polishing tools, which are rotating, against the front-side surface of the substrate while advancing the plurality of the polishing tools in their longitudinal direction.

In an embodiment, pressing the plurality of polishing tools, which are rotating, against the front-side surface of the substrate comprises pressing the plurality of polishing tools, which are rotating, against the front-side surface of the substrate without advancing the plurality of the polishing tools in their longitudinal direction.

In an embodiment, the plurality of polishing tools are a plurality of polishing tapes each having a polishing surface formed of a polishing layer containing abrasive grains.

In an embodiment, there is provided a polishing method comprising: preparing a substrate having a front-side surface on which interconnect patterns are to be formed and a back-side surface on which no interconnect patterns are to be formed; rotating the substrate while holding the back-side surface of the substrate with a vacuum suction stage; rotating a polishing head holding a plurality of polishing tools; and polishing the front-side surface of the substrate by pressing the plurality of polishing tools, which are rotating, against the front-side surface of the substrate while oscillating the polishing head parallel to the front-side surface of the substrate, thereby polishing the front-side surface.

In an embodiment, there is provided a polishing apparatus comprising: a vacuum suction stage having a holding surface configured to hold a back-side surface of a substrate; a stage motor configured to rotate the vacuum suction stage; a polishing head; a plurality of polishing tools attached to the polishing head; a head motor configured to rotate the polishing head and the plurality of polishing tools; and an actuator configured to exert a downward load on the polishing head to cause the polishing head to press the plurality of polishing tools against a front-side surface of the substrate.

In an embodiment, the polishing apparatus further comprises an oscillating mechanism configured to oscillate the polishing head parallel to the holding surface of the vacuum suction stage.

In an embodiment, the polishing apparatus further comprises a state detection sensor configured to detect a state of the front-side surface of the substrate.

In an embodiment, the polishing apparatus further comprises a liquid supply nozzle configured to supply a liquid, the liquid supply nozzle having an ejection orifice disposed approximately parallel to the holding surface.

In an embodiment, there is provided a substrate processing system for processing substrates successively, comprising: a polishing apparatus; a particle counter configured to count the number of fine protrusions existing on a front-side surface of a substrate that has been polished by the polishing apparatus; an operation controller configured to receive the number of fine protrusions and change a polishing recipe for polishing a next substrate in the polishing apparatus, wherein the polishing apparatus includes: a vacuum suction stage having a holding surface configured to hold a back-side surface of the substrate; a stage motor configured to rotate the vacuum suction stage; a polishing head; a plurality of polishing tools attached to the polishing head; a head motor configured to rotate the polishing head and the plurality of polishing tools; and an actuator configured to exert a downward load on the polishing head to enable the polishing head to press the plurality of polishing tools against the front-side surface of the substrate.

In an embodiment, there is provided a non-transitory computer-readable storage medium storing a program for causing a computer to perform the steps of: instructing a substrate rotating mechanism to hold a back-side surface of a substrate and rotate the substrate; instructing a head motor, coupled to a polishing head, to rotate polishing tools attached to the polishing head; and instructing an actuator, coupled to the polishing head, to exert a downward load on the polishing head to press the polishing tools against a front-side surface of the substrate on which interconnect patterns are to be formed.

According to the above-described embodiments, the use of the plurality of polishing tools having abrasive grains fixed thereto can realize polishing of the front-side surface of the substrate with low contamination, because it is not necessary to use slurry. Moreover, since no interconnect patterns are formed on the back-side surface of the substrate, the vacuum suction stage can be used to hold the back-side surface of the substrate. There is no need to provide a mechanism of supporting the substrate with static pressure of a fluid, and therefore, the low-cost polishing apparatus can be achieved. In addition, the holding surface of the vacuum suction stage can be made to have substantially the same size as the substrate. As a result, the entirety of the polishing apparatus can be made compact.

DESCRIPTION OF EMBODIMENTS

Embodiments will be described below with reference to the figures.

Figure 1:
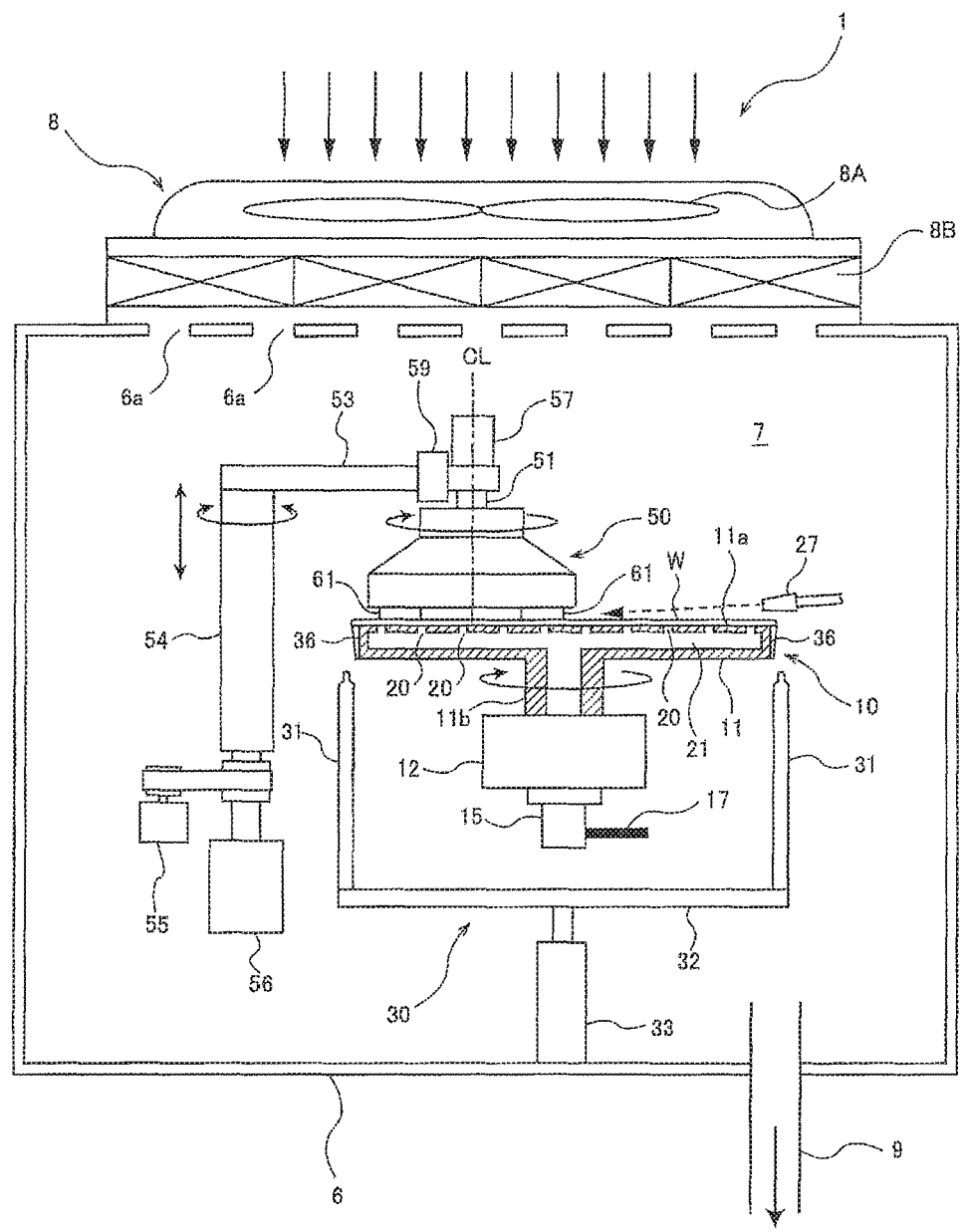
FIG. 1 is a plan view schematically showing an embodiment of a polishing apparatus.

FIG. 1 is a plan view schematically showing an embodiment of a polishing apparatus. As shown in FIG. 1, a polishing apparatus 1 includes a substrate rotating mechanism 10 configured to hold a back-side surface of a substrate W, such as a wafer, and rotate the substrate W about its central axis, a polishing head 50 configured to hold a plurality of polishing tapes 61 for polishing a front-side surface of the substrate W held by the substrate rotating mechanism 10, a liquid supply nozzle 27 configured to supply a liquid onto the front-side surface of the substrate W, and a lifting mechanism 30 configured to lift the substrate W. The polishing head 50 is disposed at an upper side of the substrate W held by the substrate rotating mechanism 10. The liquid to be supplied from the liquid supply nozzle 27 is a liquid containing no abrasive grains therein. For example, the liquid may be pure water or alkaline water. The polishing tapes 61 are one example of polishing tools for polishing the front-side surface of the substrate W.

The polishing apparatus 1 includes a partition wall 6 and a ventilating device 8. An inside space of the partition wall 6 provides a processing chamber 7. The substrate rotating mechanism 10, the polishing head 50, the liquid supply nozzle 27, and the lifting mechanism 30 are disposed in the processing chamber 7. The partition wall 6 has a door (not shown), so that the substrate W can be carried into the processing chamber 7 through the door and can be carried out from the processing chamber 7 through the door. Clean-air intakes 6a are formed in an upper portion of the partition wall 6, and an exhaust duct is formed in a lower portion of the partition wall 6. The ventilating device 8 is provided on an upper surface of the partition wall 6. This ventilating device 8 includes a fan 8A, and a filter 8B for removing particles and dusts contained in an air sent from the fan 8A. The ventilating device 8 is configured to send a clean air into the processing chamber 7 through the clean-air intakes 6a and discharge a gas from the processing chamber 7 through the exhaust duct 9. The clean air forms a down flow in the processing chamber 7. Polishing of a substrate, which will be described below, is performed in the processing chamber 7 so that debris, particles, mist, and the like, which can be produced in polishing of the substrate, are prevented from spreading outside the polishing apparatus. Therefore, it is possible to effectively prevent such particles and the like from adhering to the substrate W that has been polished.

The front-side surface of the substrate W is a surface on which interconnect patterns are to be formed. More specifically, the front-side surface of the substrate W is a surface on which interconnect patterns are to be formed by nanoimprint or other technique after the substrate W is polished by the polishing apparatus 1. Examples of the surface on which interconnect patterns are to be formed include a surface on which a resist is to be formed. The back-side surface of the substrate W is a surface on which no interconnect patterns are to be formed. Examples of the surface on which no interconnect patterns are to be formed include a silicon surface.

The substrate rotating mechanism 10 includes a vacuum suction stage 11 configured to hold the back-side surface of the substrate W by vacuum suction, a stage motor 12 configured to rotate the vacuum suction stage 11, a rotary joint 15 coupled to the vacuum suction stage 11, and a vacuum line 17 coupled to the rotary joint 15. In this embodiment, the stage motor 12 is a hollow motor. The vacuum suction stage 11 has a shaft portion 11b extending through the stage motor 12 and coupled to the rotary joint 15. In one embodiment, the stage motor 12 may be disposed laterally of the shaft portion 11b of the vacuum suction stage 11, and may be coupled to the shaft portion 11b of the vacuum suction stage 11 by a transmission mechanism, such as a belt.

The vacuum suction stage 11 includes a holding surface 11a configured to hold the back-side surface of the substrate W, suction holes 20 which open in the holding surface 11a and an internal chamber 21 in fluid communication with the suction holes 20. The internal chamber 21 communicates with the above-described rotary joint 15. The vacuum line 17 communicates with the suction holes 20 through the rotary joint 15 and the internal chamber 21. When the vacuum line 17 produces a vacuum (or negative pressure) in the suction holes 20, the back-side surface of the substrate W is attracted to the holding surface 11a. The holding surface 11a has substantially the same size as the substrate W. In this embodiment, the substrate W and the holding surface 11a are in the shape of circle, and the holding surface 11a has substantially the same diameter as the diameter of the substrate W. Therefore, the entirety of the back-side surface of the substrate W is supported by the holding surface 11a.

The substrate W is held horizontally by the vacuum suction stage 11, and is rotated about the central axis of the vacuum suction stage 11 (coinciding with the central axis of the substrate W) by the stage motor 12. The liquid supply nozzle 27 is disposed above the vacuum suction stage 11. This liquid supply nozzle 27 is coupled to a liquid supply source (not shown), and is configured to supply the liquid (e.g., pure water or alkaline water) onto the front-side surface of the substrate W. The liquid supply nozzle 27 has an ejection orifice which is approximately parallel to the holding surface 11a of the vacuum suction stage 11, and is oriented toward the polishing tapes 61 held by the polishing head 50. The liquid supply nozzle 27 may be inclined to a degree such that the liquid supply nozzle 27 is approximately parallel to the holding surface 11a of the vacuum suction stage 11. For example, an angle of the liquid supply nozzle 27 with respect to the holding surface 11a of the vacuum suction stage 11 in a range of 1 to 15 degrees. The liquid is jetted in a direction approximately parallel to the front-side surface of the substrate W toward contact points of the polishing tapes 61 and the front-side surface of the substrate W.

The above-discussed configurations can more effectively form the flow of the liquid toward the periphery of the substrate W to remove particles that have been separated from the substrate W. As a result, fine foreign matters do not remain on the substrate W. The use of such substrate W in the transferring process of the nanoimprint does not cause an adverse effect on a template.

The term "approximately parallel" includes an inclined state at an angle of 1 degree or more and less than 15 degrees. If the direction of the liquid jet is completely parallel to the front-side surface of the substrate W, the liquid cannot touch the substrate W sufficiently. On the other hand, if an angle between the direction of the liquid jet and the front-side surface of the substrate W is too large, it is unlikely to form the flow of the liquid toward the periphery of the substrate W. The liquid supply nozzle 27 may be configured to swing vertically within an inclination angle of 1 degree or more and less than 15 degrees so as to enhance the cleaning effect.

In one embodiment, the flow velocity of the liquid jetted from the liquid supply nozzle 27 is in a range of 1 m/second to 10 m/second. If the flow velocity of the liquid higher than 10 m/second, the substrate W may be damaged or broken, and the liquid containing polishing debris may bounce back to the substrate W. On the other hand, if the flow velocity of the liquid lower than 1 m/second, the flow of the liquid may not be able to remove the polishing debris sufficiently from the substrate W. According to this embodiment, the liquid jet reaches the substrate W at an appropriate flow velocity and at an appropriate angle, the liquid can remove the polishing debris from the substrate W and can therefore prevent scratches of the substrate W due to the remaining polishing debris.

The liquid supply nozzle 27 may be arranged so as to jet the liquid to a region, upstream of the polishing head 50, of the rotating substrate W, so that more efficient cleaning effect is expected. In order to more improve the cleaning effect, the liquid supply nozzle 27 may be configured to swing horizontally relative to the substrate W.

The polishing head 50 is disposed above the holding surface 11a of the vacuum suction stage 11. In this embodiment, the holding surface 11a of the vacuum suction stage 11 has a circular shape, and the lateral width of the polishing head 50 is smaller than the diameter of the holding surface 11a of the vacuum suction stage 11 and the diameter of the substrate W. In one embodiment, the lateral width of the polishing head 50 is half the diameter of the holding surface 11a of the vacuum suction stage 11.

Figure 2:
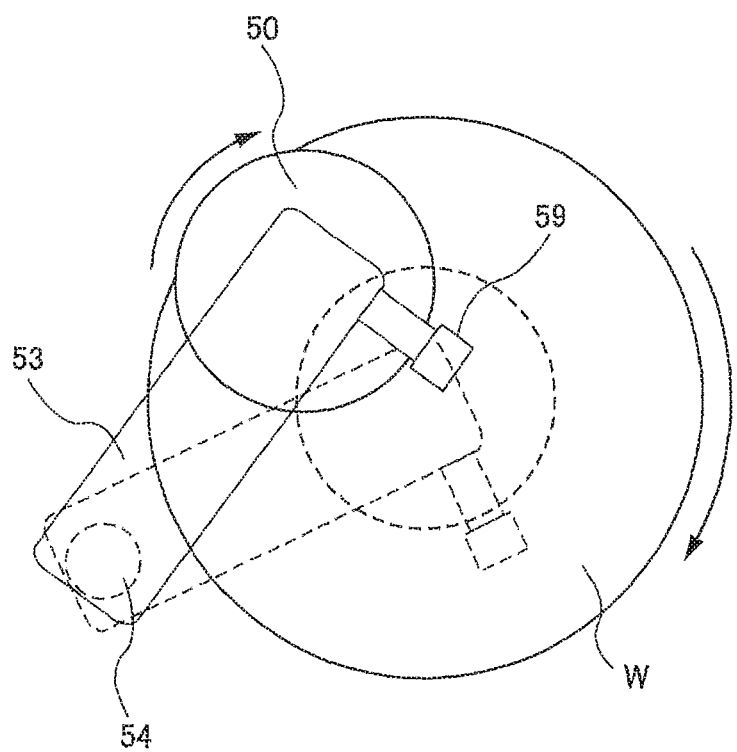
FIG. 2 is a view showing a polishing head which is configured to oscillate between an outer portion and a central portion of a front-side surface of a substrate.
Figure 3:
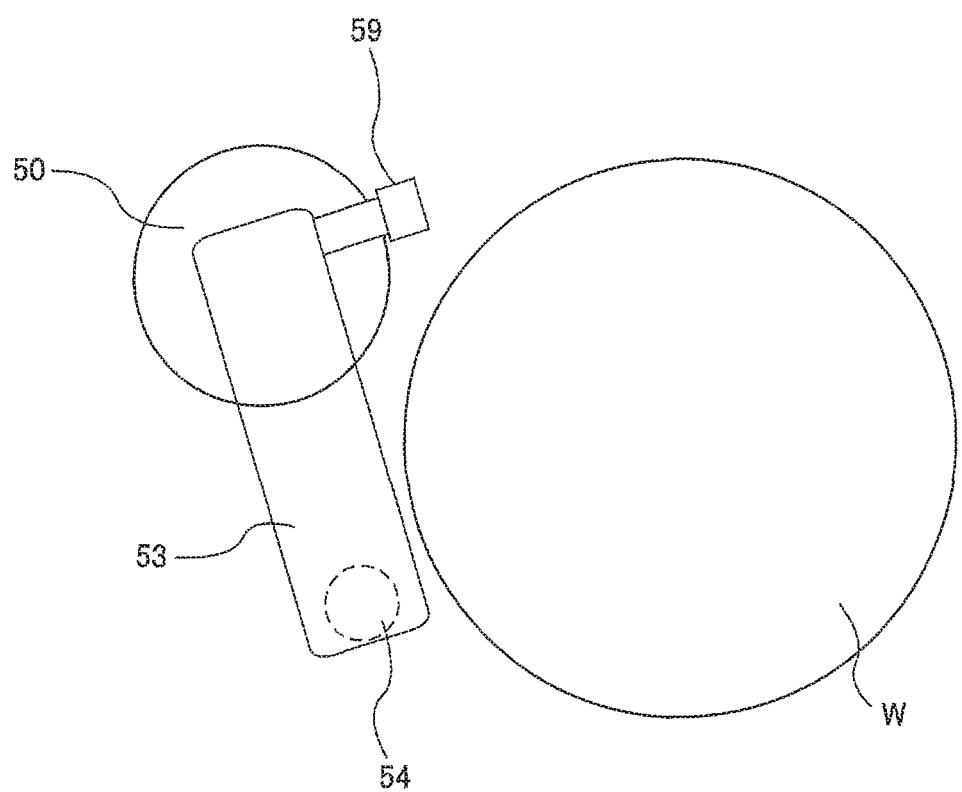
FIG. 3 is a view showing the polishing head that has been moved to a retreated position outside a vacuum suction stage.

The polishing head 50 is coupled to a polishing-head shaft 51. This polishing-head shaft 51 is coupled to one end of a swing arm 53, and the other end of the swing arm 53 is coupled to a pivot shaft 54. This pivot shaft 54 is coupled to a shaft-rotating mechanism 55, which may include a motor, pulleys, and a belt. When the pivot shaft 54 is rotated by the shaft-rotating mechanism 55 through a predetermined angle in a clockwise direction and a counterclockwise direction, the polishing head 50 oscillates between an outer portion and a central portion of the front-side surface of the substrate W, as shown in FIG. 2. As shown in FIG. 3, when the pivot shaft 54 is further rotated by the shaft-rotating mechanism 55, the polishing head 50 is moved to a retreated position outside the vacuum suction stage 11. In this embodiment, the shaft-rotating mechanism 55 and the pivot shaft 54 constitute an oscillating mechanism that causes the polishing head 50 to oscillate in directions parallel to the holding surface 11a of the vacuum suction stage 11.

As shown in FIG. 1, the pivot shaft 54 is coupled to a polishing-head elevating mechanism 56 configured to elevate and lower the pivot shaft 54, the polishing-head shaft 51, and the polishing head 50. The polishing-head elevating mechanism 56 may be an air cylinder, or a combination of a servomotor and a ball screw.

Figure 4:
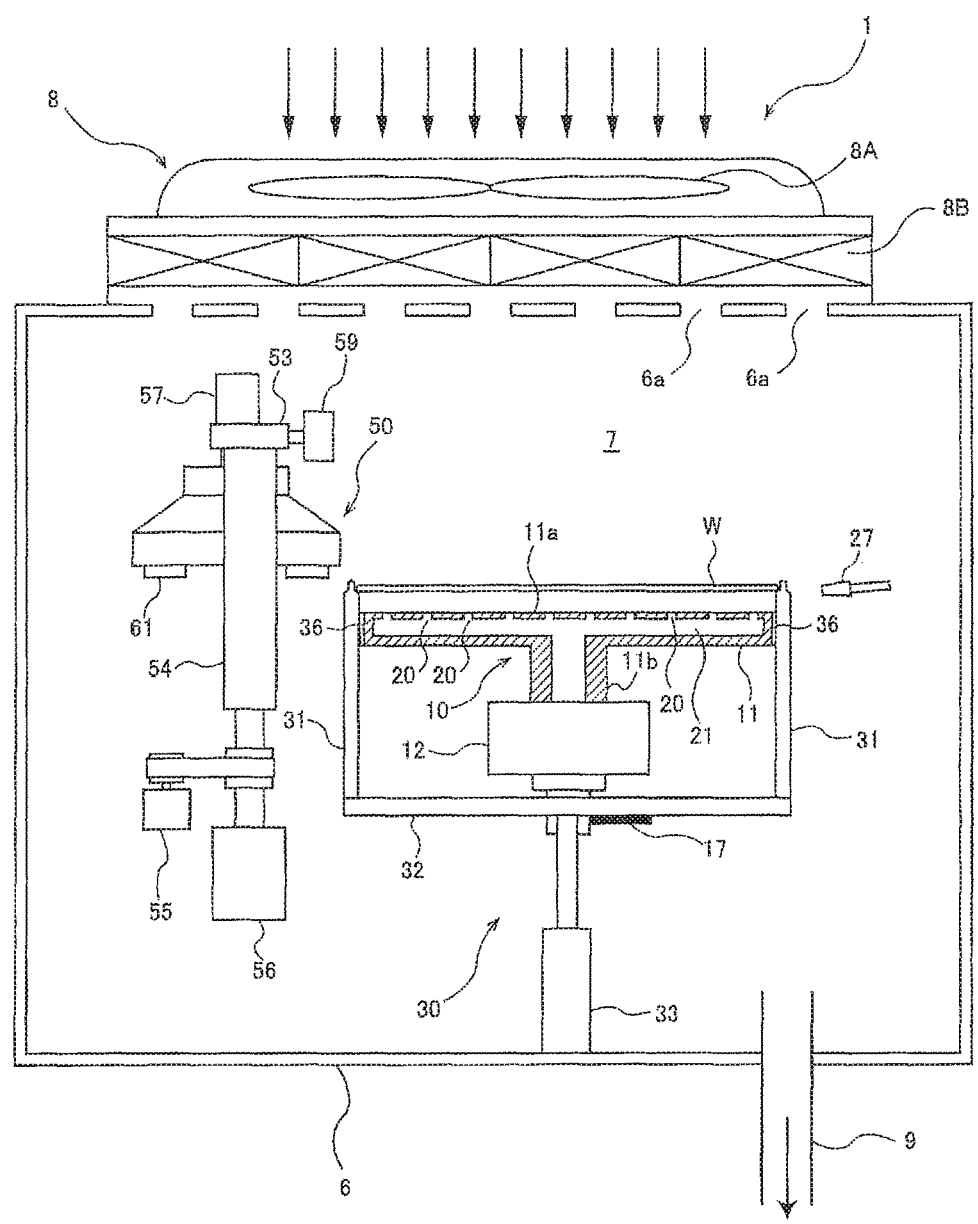
FIG. 4 is a view showing a state in which lift pins are at an elevated position and the polishing head is at the retreated position.

The lifting mechanism 30 includes a plurality of lift pins 31 for supporting an edge of the substrate W, a bridge 32 that couples the lift pins 31 to each other, and an elevating device 33 coupled to the bridge 32. In this embodiment, four lift pins 31 are disposed, and an air cylinder is used as the elevating device 33. This elevating device 33 is configured to be able to elevate and lower the bridge 32 and the lift pins 31 relative to the vacuum suction stage 11. More specifically, the elevating device 33 is configured to elevate and lower the lift pins 31 between an elevated position and a lowered position. The elevated position is a position at which upper ends of the lift pins 31 are higher than the holding surface 11a of the vacuum suction stage 11. The lowered position is a position at which the upper ends of the lift pins 31 are lower than the holding surface 11a of the vacuum suction stage 11. FIG. 1 shows a state in which the lift pins 31 are at the lowered position and the polishing head 50 is located on the substrate W, while FIG. 4 shows a state in which the lift pins 31 are at the elevated position and the polishing head 50 is located at the above-described retreated position. The liquid supply nozzle 27 is also configured to be able to move between a liquid-supply position shown in FIG. 1 and a retreated position shown in FIG. 4.

Figure 5:
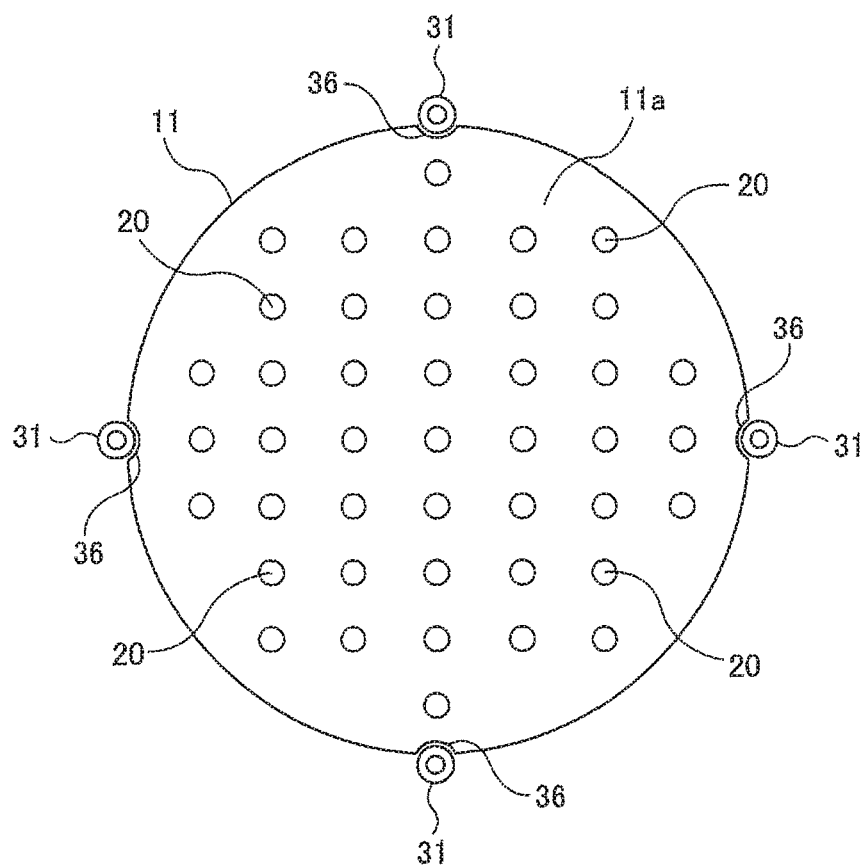
FIG. 5 is a plan view showing the vacuum suction stage and the lift pins.

FIG. 5 is a plan view showing the vacuum suction stage 11 and the lift pins 31. As shown in FIG. 5, recesses 36 are formed in the periphery of the vacuum suction stage 11 for allowing the lift pins 31 to pass through the recesses 36, respectively. In this embodiment, each recess 36 has a horizontal-cross section in a form of a semicircle that is shaped along a circumferential surface of the lift pin 31. When the polishing head 50 is at the retreated position and the lift pins 31 are at the elevated position, the substrate W is placed onto the lift pins 31 by a transfer robot (which will be described later). When the lift pins 31 are lowered to a position lower than the holding surface 11a of the vacuum suction stage 11, the substrate W is placed on the holding surface 11a. Further, after polishing of the substrate W, the substrate W is lifted from the holding surface 11a by the lift pins 31. When the polishing head 50 is at the retreated position and the lift pins 31 are at the elevated position, the substrate W is removed from the lift pins 31 by the transfer robot.

Figure 6:
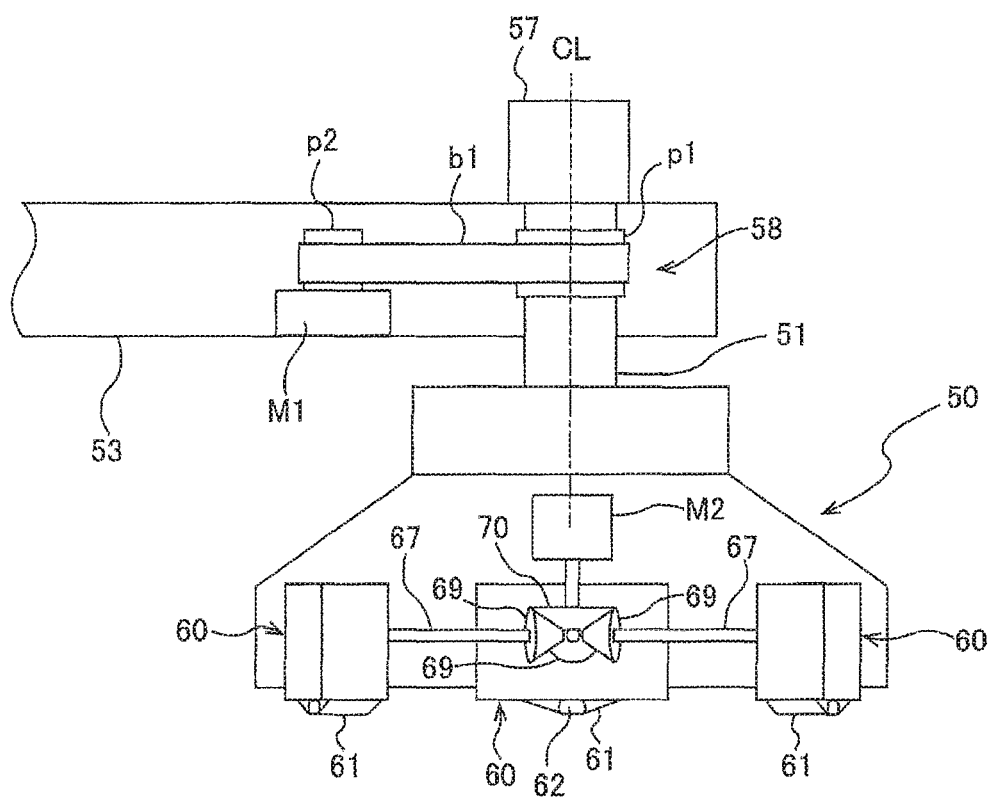
FIG. 6 is a view showing detailed structures of the polishing head and a swing arm.

FIG. 6 is a view showing detailed structures of the polishing head 50 and the swing arm 53. The polishing-head shaft 51 is coupled to a polishing-head rotating mechanism 58 configured to rotate the polishing head 50 about its central axis CL. This central axis CL is perpendicular to the holding surface 11a of the vacuum suction stage 11 and the front-side surface, to be polished, of the substrate W. The polishing-head rotating mechanism 58 is provided in the swing arm 53. The polishing-head rotating mechanism 58 includes a pulley p1 fixed to the polishing-head shaft 51, a head motor M1 mounted to the swing arm 53, a pulley p2 fixed to a rotational shaft of the head motor M1, and a belt b1 riding on the pulleys p1, p2. Rotation of the head motor M1 is transmitted through the pulleys p1, p2 and the belt b1 to the polishing-head shaft 51, which rotates the polishing head 50.

An air cylinder 57 is coupled to the upper end of the polishing-head shaft 51. This air cylinder 57 is an actuator configured to exert a downward load on the polishing head 50. The polishing-head shaft 51 has vertically-extending grooves (not shown) formed in a surface thereof, and the pulley p1 has load-transmission balls (not shown) which engage with the grooves of the polishing-head shaft 51. These grooves and the load-transmission balls constitute a ball spline bearing. Therefore, the pulley p1 can transmit a torque to the polishing-head shaft 51 while allowing the polishing-head shaft 51 to move in the vertical direction.

The polishing tapes 61 for polishing the front-side surface of the substrate W are removably mounted to the polishing head 50. The polishing tapes 61 are arranged at equal intervals around the central axis CL. The air cylinder 57 exerts the downward load on the polishing head 50, so that the polishing head 50, while rotating about the central axis CL, presses the polishing tapes 61 against the front-side surface of the substrate W.

Polishing of the substrate W is performed as follows. While the vacuum suction stage 11, holding the substrate W thereon, is rotated, the liquid jet is delivered to the contact points of the front-side surface of the substrate W and the polishing tapes 61 held by the polishing head 50. The polishing tapes 61 are pressed against the front-side surface of the substrate W by the polishing head 50, while the polishing head 50 and the polishing tapes 61 are rotated about the central axis CL by the polishing-head rotating mechanism 58. The rotating direction of the polishing head 50 and the rotating direction of the vacuum suction stage 11 may be the same or opposite. The polishing tapes 61 rub against the front-side surface of the substrate W in the presence of the liquid, so that the polishing tapes 61 can polish the front-side surface of the substrate W. During polishing of the substrate W, the polishing head 50 oscillates between the outer portion and the central portion of the front-side surface of the substrate W as shown in FIG. 2, while the polishing head 50 are rotating about its own central axis CL and are pressing the polishing tapes 61 against the front-side surface of the substrate W.

As shown in FIG. 2, when the polishing head 50 is located at the outer portion of the front-side surface of the substrate W, a part of the polishing tapes 61 protrude outwardly from the substrate V. Therefore, the polishing tapes 61 can polish the entirety of the front-side surface of the substrate W. In a case where the lateral width of the polishing head 50 is larger than the radius of the holding surface 11a of the vacuum suction stage 11 and smaller than the holding surface 11a, the polishing head 50 may not oscillate during polishing of the substrate W. Polishing of the substrate W with use of the polishing tapes 61 is a process of scraping away the front-side surface of the substrate W to thereby remove fine protrusions from the front-side surface of the substrate W and/or remove at least a part of material constituting the front-side surface of the substrate W.

The force applied from the polishing head 50 through the polishing tapes 61 to the substrate W during polishing of the substrate W is received by the holding surface 11a of the vacuum suction stage 11. Since the holding surface 11a of the vacuum suction stage 11 has substantially the same size as the substrate W, the entirety of the back-side surface of the substrate W is supported by the holding surface 11a. Therefore, the substrate W does not bend when the polishing head 50 presses the polishing tapes 61 against the substrate W.

Because the polishing head 50 is smaller than the substrate W, the polishing tapes 61 can locally polish the front-side surface of the substrate W. When the polishing head 50 oscillates, a moving speed and/or a rotating speed of the polishing head 50 may be set in advance for each of segments predefined on the front-side surface of the substrate W. For example, in order to increase an amount of polishing at the outer portion of the substrate W, the moving speed of the polishing head 50 may be lowered, and/or the rotating speed of the polishing head 50 may be increased at a segment on the outer portion of the substrate W. In this manner, by changing the moving speed and/or the rotating speed of the polishing head 50 during polishing of the substrate W, a desired film-thickness profile can be produced.

As shown in FIG. 1 through FIG. 3, a state detection sensor 59 for detecting a state of the front-side surface of the substrate W may be attached to the swing arm 53. This state detection sensor 59 can detect the state of the entirety of the front-side surface of the substrate W while the state detection sensor 59 oscillates together with the polishing head 50. Examples of the state of the front-side surface of the substrate W include film thickness, the number of fine protrusions, and surface roughness. A known optical sensor can be used as the state detection sensor 59 for detecting the state of the front-side surface of the substrate W. The optical sensor is configured to direct light to the front-side surface of the substrate W and detect the state of the front-side surface of the substrate W based on optical information contained in reflected light from the front-side surface of the substrate W. In addition, polishing conditions for the front-side surface of the substrate W may be changed during polishing of the substrate W, based on the detection result of the state of the front-side surface of the substrate W.

Figure 7:
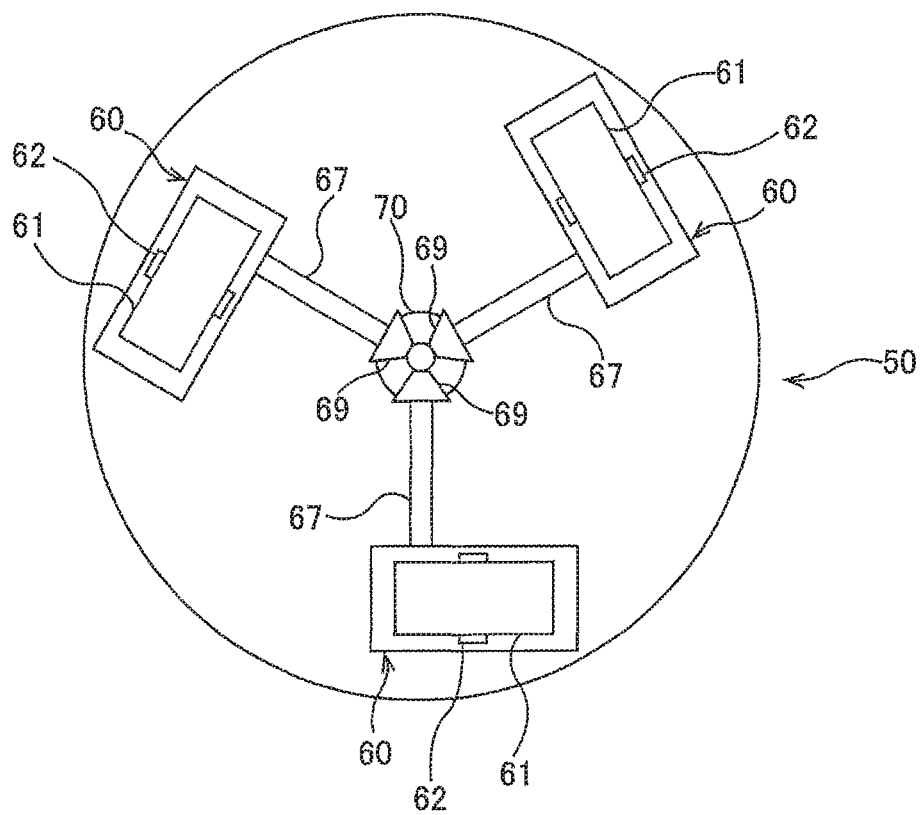
FIG. 7 is a view of the polishing head as viewed from below.

FIG. 7 is a bottom view of the polishing head 50. A plurality of (three in FIG. 7) tape cartridges 60 are removably attached to the polishing head 50. The tape cartridges 60 include the polishing tapes 61 therein, respectively. These tape cartridges 60 are installed in the polishing head 50.

Figure 8:
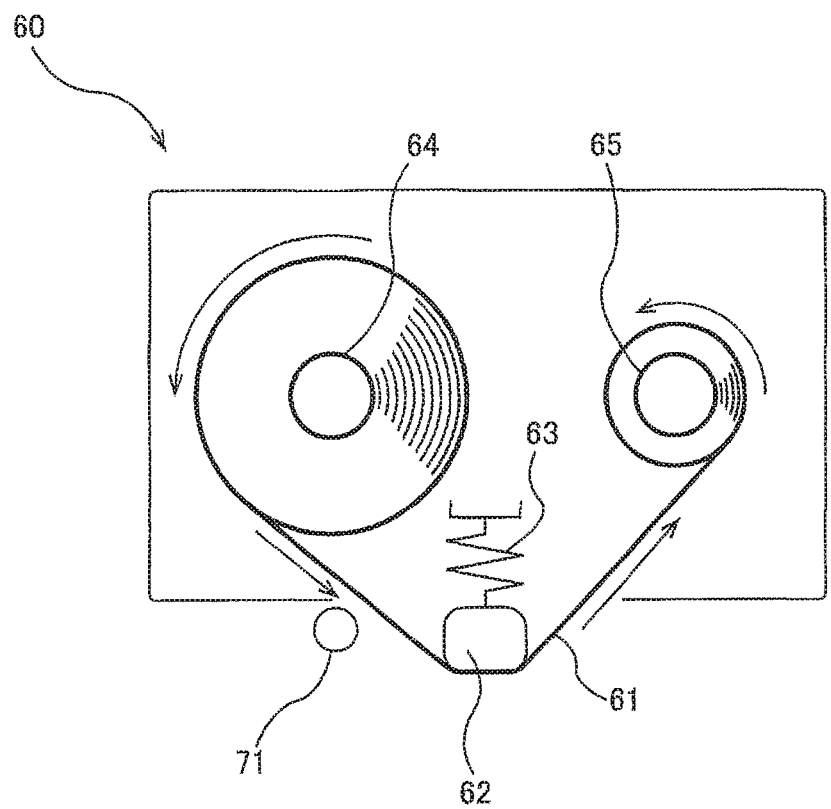
FIG. 8 is a cross-sectional view showing a tape cartridge.

FIG. 8 is a cross-sectional view of the tape cartridge 60. As shown in FIG. 8, each tape cartridge 60 includes: the polishing tape 61; a support member 62 that supports the back side of the polishing tape 61; a biasing device 63 for biasing the support member 62 toward the holding surface 11*a* of the vacuum suction stage 11; a tape feeding reel 64 for feeding the polishing tape 61; and a tape take-up reel 65 for taking up the polishing tape 61 that has been used in the polishing process. In the embodiment shown in FIG. 8, a spring is used as the biasing device 63. The polishing tape 61 advances from the tape feeding reel 64 to the tape take-up reel 65 via the support member 62. The plurality of support members 62 extend in radial directions of the polishing head 50 and are arranged at equal intervals around the central axis CL (see FIG. 1) of the polishing head 50. Therefore, the polishing tapes 61 have respective substrate contact surfaces extending in radial directions of the polishing head 50.

The tape take-up reels 65 of the tape cartridges 60 are coupled to one ends of tape take-up shafts 67 as shown in FIGS. 6 and 7. Bevel gears 69 are secured to the other ends of the tape take-up shafts 67, respectively. These bevel gears 69, which are coupled to the tape cartridges 60, are in mesh with a bevel gear 70 which is coupled to an advancing motor M2. With these configurations, the tape take-up reels 65 of the tape cartridges 60 are driven by the advancing motor M2 to take up the polishing tapes 61. The advancing motor M2, the bevel gears 69 and 70, and the tape take-up shafts 67 jointly construct a tape advancing mechanism for advancing the polishing tapes 61 from the tape feeding reels 64 to the tape take-up reels 65. This tape advancing mechanism can advance the polishing tapes 61 in their longitudinal direction at predetermined speed.

Each polishing tape 61 has a width ranging from 10 mm to 60 mm and has a length ranging from 20 m to 100 m. The polishing tape 61 has one side constituted by a polishing layer containing abrasive grains. A surface of the polishing layer provides a polishing surface of the polishing tape 61. Particles of silica ($SiO_2$) having a diameter of about 20 nm are used as the abrasive grains. The abrasive grains made of silica have an advantage that they are unlikely to form scratches on the surface of the substrate W. The use of such polishing tape 61 can remove fine protrusions existing on the substrate W, in particular particles embedded in the surface of the substrate W.

When the substrate W is being polished, the polishing tape 61 is advanced at a predetermined speed from the tape feeding reel 64 to the tape take-up reel 65. Therefore, a new (i.e., unused) polishing surface of the polishing tape 61 is brought into contact with the substrate W at all times. Alternatively, the polishing tape 61 may be advanced right after starting of polishing, and may not be advanced after a predetermined time (e.g., about 1 second) has elapsed. Each polishing tape 61 has an end mark (not shown) near the terminal end thereof. This end mark is detected by an end-mark detection sensor 71 which is disposed in proximity to the polishing tape 61. When the end-mark detection sensor 71 detects the end mark on the polishing tape 61, the end-mark detection sensor 71 sends a detection signal to an operation controller (which will be described later). Upon receiving the detection signal, the operation controller produces a signal, such as an alarm signal, for prompting a user to replace the polishing tape 61 with new one. Since the tape cartridges 60 are removable individually, each tape cartridge 60 can easily be replaced with new one.

The polishing tape 61 may include a base layer formed of a PET (polyethylene terephthalate) tape, a binder made of water-soluble synthetic resin (e.g., polyester resin), and the abrasive grains of silica ($SiO_2$) having a diameter of about 20 nm which are bound on the PET tape.

The load acting on the polishing head 50 during the polishing process is measured by a load cell which is not shown. The polishing apparatus may monitor whether the load is more than predetermined values in two-stage level. When a load of more than a first level, which can damage the substrate W, is applied, the polishing apparatus emits an alarm indicating an abnormal load to an operator, while elevating the polishing head 50 to stop the polishing process. When a load of more than a second level, which is less than the first level, is applied, the height of the polishing head 50 may be changed until the polishing head 50 is separated away from the substrate W, or, if the polishing head 50 has already been separated away from the substrate W, the liquid supply nozzle 27 may jet the liquid to a space between the polishing tapes 61 and the substrate W so as to prevent damage to the substrate W. In the latter case, a gas supply nozzle, which is not shown, may further jet a gas to the space between the polishing tapes 61 and the substrate W so as to prevent damage to the substrate W more effectively.

Figure 9:
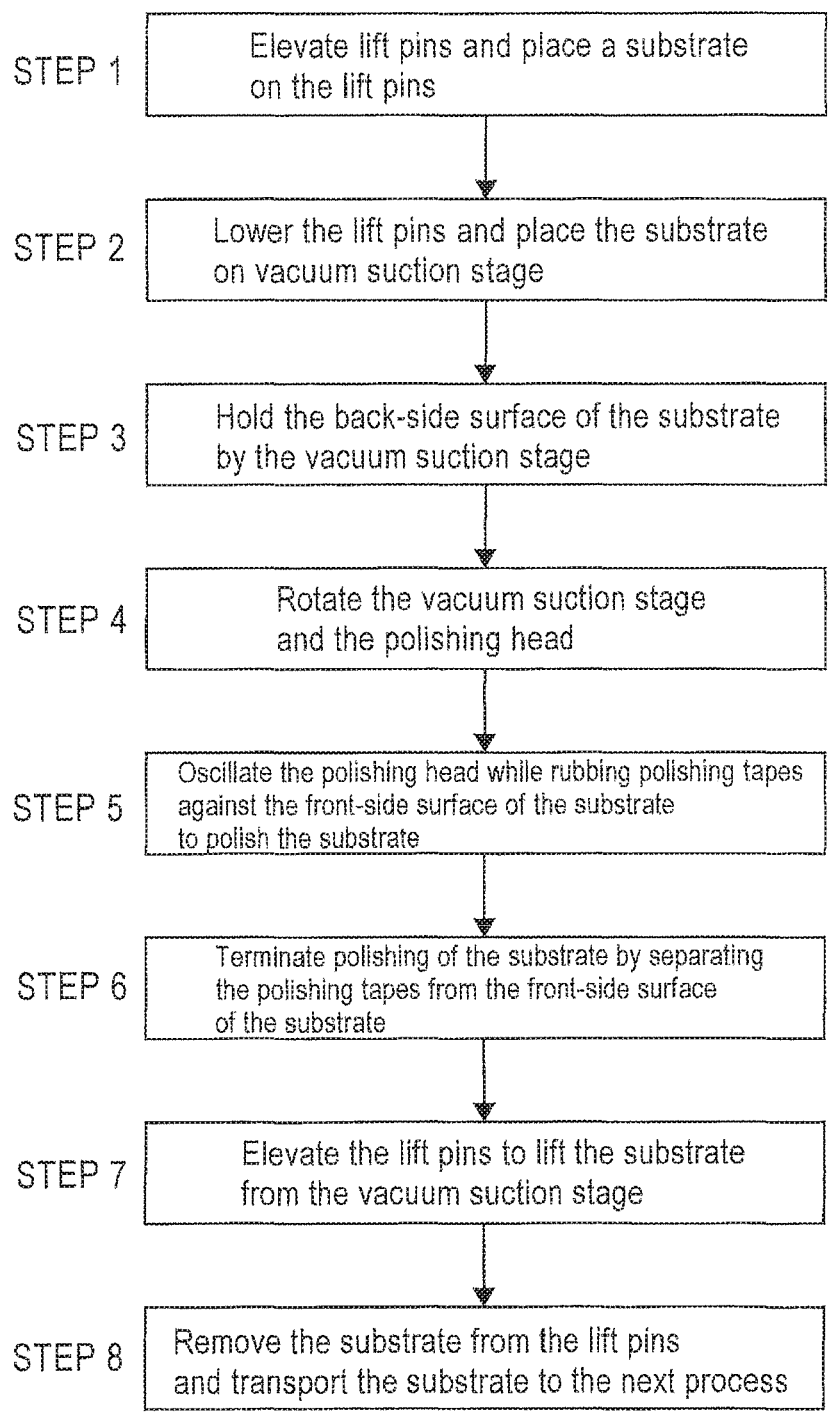
FIG. 9 is a flowchart illustrating an embodiment of operation of the above-described polishing apparatus.
Figure 10:
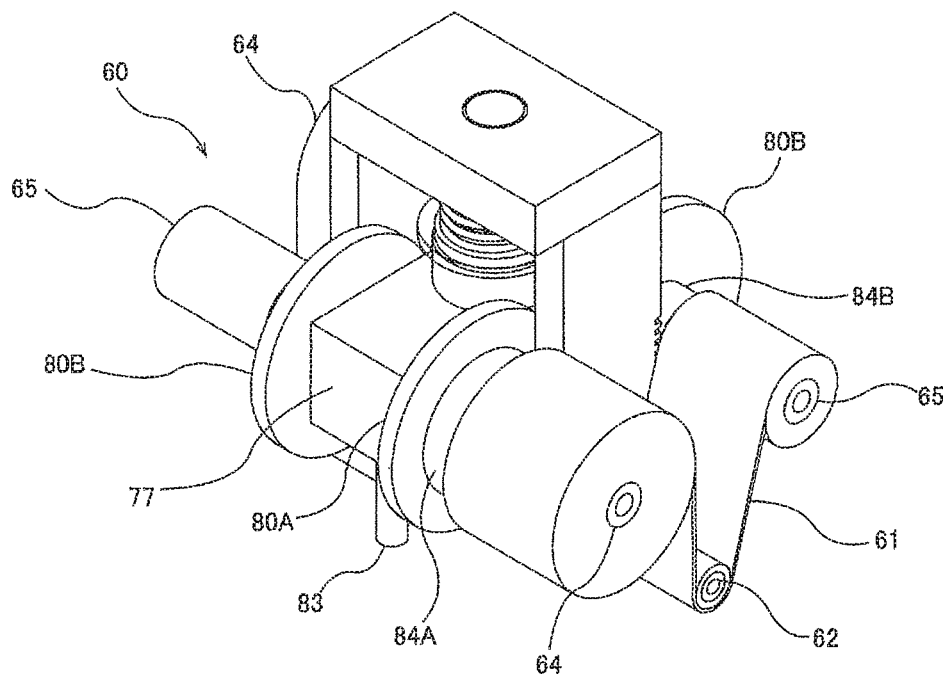
FIG. 10 is a perspective view showing another example of a tape cartridge.
Figure 11:
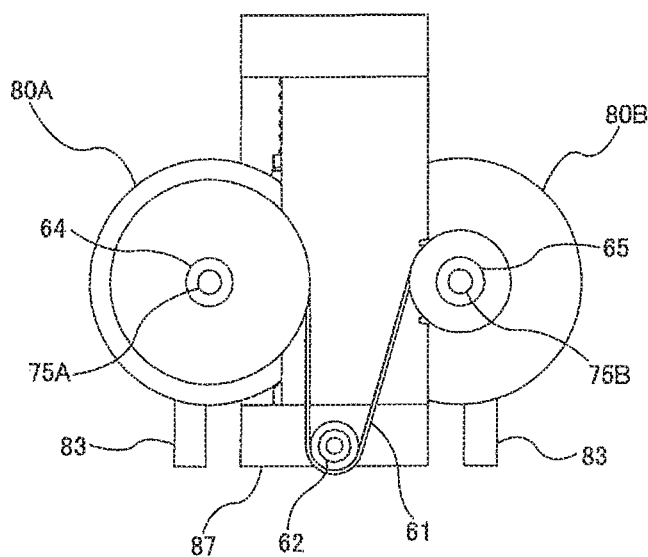
FIG. 11 is a side view of the tape cartridge shown in FIG. 10.
Figure 12:
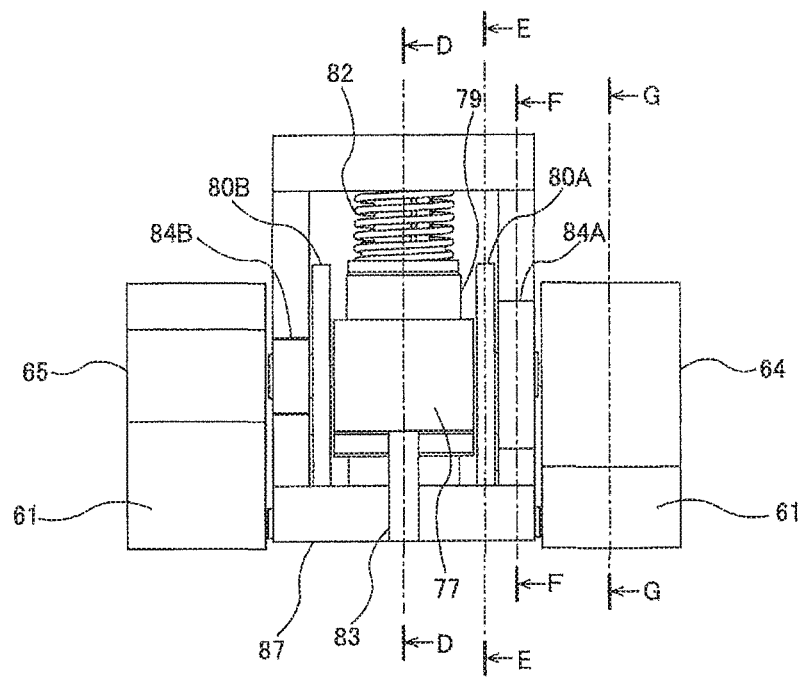
FIG. 12 is a front view of the tape cartridge shown in FIG. 10.
Figure 13:
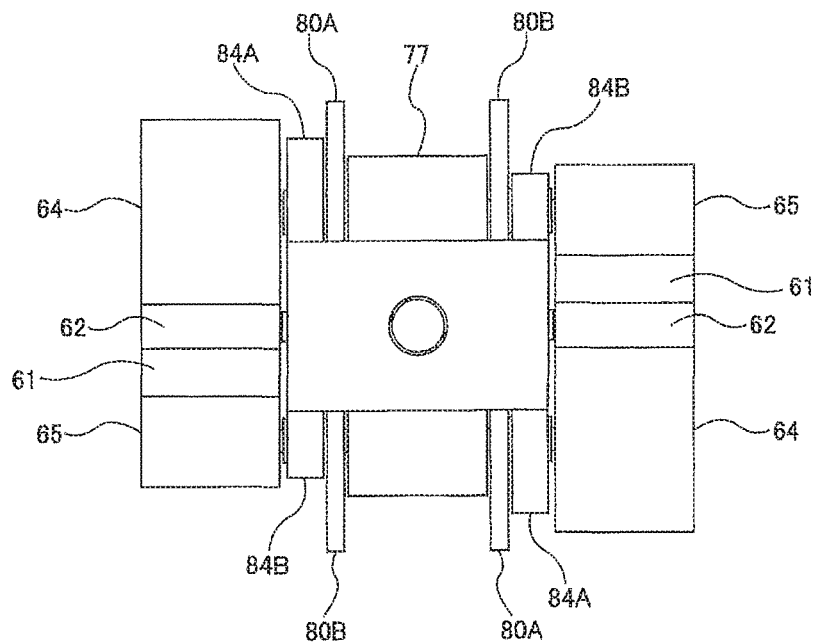
FIG. 13 is a plan view of the tape cartridge shown in FIG. 10.
Figure 14:
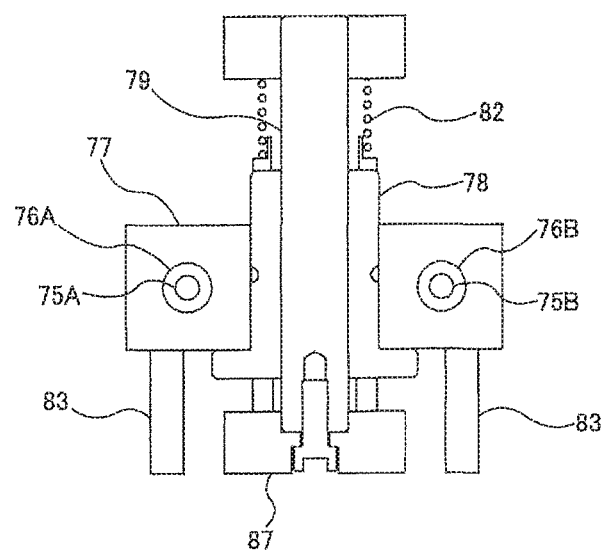
FIG. 14 is a cross-sectional view taken along line D-D shown in FIG. 12.
Figure 15:
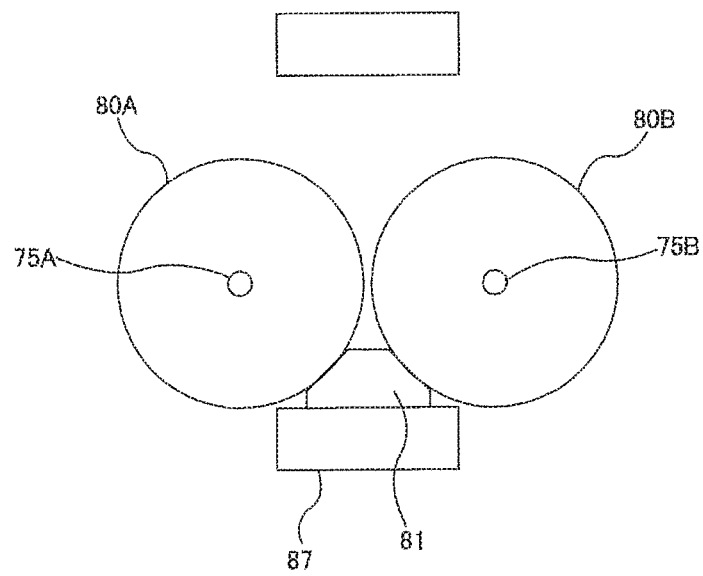
FIG. 15 is a cross-sectional view taken along line E-E shown in FIG. 12.
Figure 16:
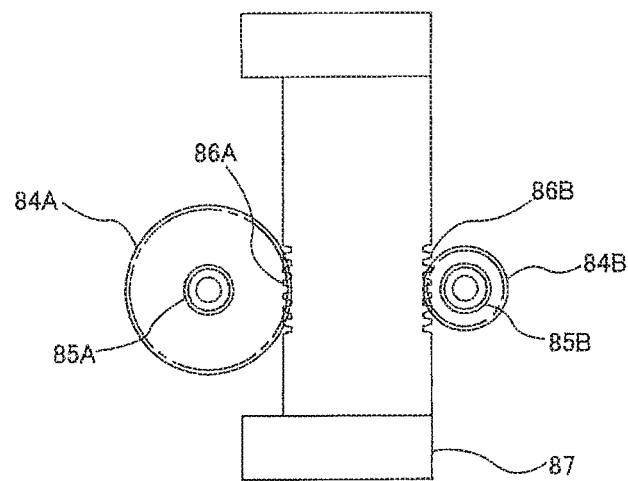
FIG. 16 is a cross-sectional view taken along line F-F shown in FIG. 12.
Figure 17:
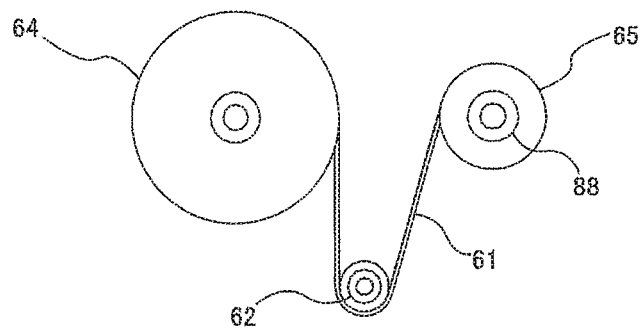
FIG. 17 is a cross-sectional view taken along line G-G shown in FIG. 12.

FIG. 9 is a flow chart showing an embodiment of the operations of the above-discussed polishing apparatus 1. In step 1, the lift pins 31 are elevated by the elevating device 33, and the substrate W, to be polished, is placed on the lift pins 31 by the transfer robot (which will be described later). The polishing head 50 is at the retreated position. In step 2, the lift pins 31 are lowered together with the substrate W, so that the substrate W is placed on the holding surface 11*a* of the vacuum suction stage 11. The lift pins 31 are further lowered below the holding surface 11a. In step 3, the vacuum (or negative pressure) is produced in the suction holes 20 of the vacuum suction stage 11 by the vacuum line 17. The back-side surface of the substrate W is hold on the holding surface 11a of the vacuum suction stage 11 by the negative pressure. The polishing head 50 is then moved from the retreated position to the position above the substrate W.

In step 4, the vacuum suction stage 11 and the polishing head 50 are rotated about their own central axes. The rotating direction of the polishing head 50 may be the same as or opposite to the rotating direction of the vacuum suction stage 11. The substrate W is rotated together with the vacuum suction stage 11. The liquid is supplied from the liquid supply nozzle 27 to the front-side surface of the rotating substrate W. In step 5, the polishing-head elevating mechanism 56 lowers the polishing head 50, and then the air cylinder 57 exerts the downward load on the polishing head 50. The polishing head 50, while rotating about its central axis CL, presses the plurality of polishing tapes 61 against the front-side surface of the substrate W. Further, the polishing head 50 oscillates between the outer portion and the central portion of the front-side surface of the substrate W in directions parallel to the front-side surface of the substrate W. The polishing tapes 61 rub against the front-side surface of the substrate W in the presence of the liquid, thereby polishing the front-side surface of the substrate W.

In step 6, after a preset polishing time has elapsed, the polishing head 50 is elevated by the polishing-head elevating mechanism 56. The polishing tapes 61 are separated from the substrate W, whereby polishing of the substrate W is terminated. Further, the rotation of the polishing head 50, the rotations of the vacuum suction stage 11 and the substrate W, and the supply of the liquid are stopped. The polishing head 50 is then moved to the retreated position. In step 7, the vacuum suction of the substrate W is stopped. The lift pins 31 are then elevated to lift the polished substrate W from the holding surface 11a of the vacuum suction stage 11. In step 8, the transfer robot removes the substrate W from the lift pins 31 and transports the substrate W to the next process.

According to the above embodiment, the use of the plurality of polishing tapes 61 having the abrasive grains fixed thereto can realize polishing of the front-side surface of the substrate W with low contamination, because it is not necessary to use slurry. Moreover, since no interconnect patterns are formed on the back-side surface of the substrate W, the vacuum suction stage 11 can be used to hold the back-side surface of the substrate W. There is no need to provide a mechanism of supporting the substrate W with static pressure of a fluid, and therefore, the low-cost polishing apparatus 1 can be achieved. In addition, the holding surface 11a of the vacuum suction stage 11 can be made to have substantially the same size as the substrate W. As a result, the entirety of the polishing apparatus 1 can be made compact. Moreover, the use of the polishing head 50 having a smaller width than the diameter of the substrate W can realize highly-efficient polishing of the substrate W.

FIGS. 10 through 17 show another example of the tape cartridge 60. In this example, the polishing head 50 does not include the advance motor M2 therein for advancing the polishing tapes 61. The tape feeding reel 64 and the tape take-up reel 65 are mounted respectively to reel shafts 75A and 75B, which are rotatably supported by respective bearings 76A and 7613 secured to a reel housing 77. This reel housing 77 is secured to a ball spline nut 78. The reel housing 77 and the ball spline nut 78 are vertically movable relative to a spline shaft 79.

Brake wheels 80A and 80B are fixed to the reel shafts 75A and 75B, respectively. The tape feeding reel 64 and the brake wheels 80A are rotatable in unison with each other, and the tape take-up reel 65 and the brake wheels 80B are rotatable in unison with each other. The ball spline nut 78 is forced downward by a spring 82, so that the brake wheels 80A and 80B are pressed against a brake pad 81 by the spring 82. When the brake pad 81 is in contact with the brake wheels 80A and 80B, the brake wheels 80A and 80B and the tape feeding reel 64 and the tape take-up reel 65 coupled thereto are unable to rotate freely. Downwardly extending pins 83 are fixed to the reel housing 77. These pins 83 are brought into contact with pin stoppers (not shown) which are provided in the retreat position of the scrubber 50.

Figure 19:
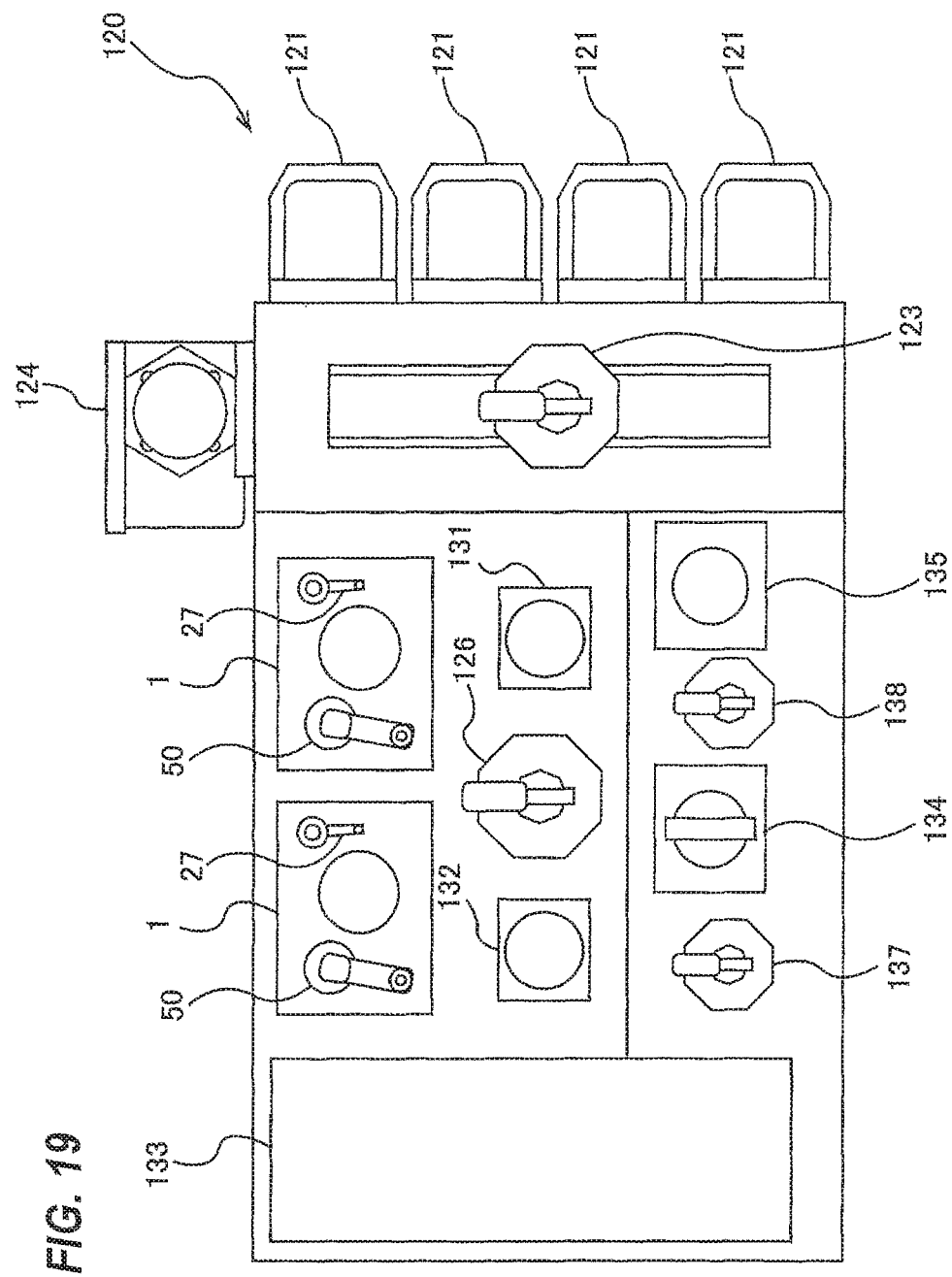
FIG. 19 is a plan view showing a substrate processing system including the above-described polishing apparatus.

A tape feeding gear 84A is mounted to the reel shaft 75A, and a tape take-up gear 84B is mounted to the reel shaft 75B, as shown in FIG. 19. The tape feeding gear 84A has a larger diameter than that of the tape take-up gear 84B. The tape feeding gear 84A and the tape take-up gear 84B are attached respectively to the reel shafts 74A and 75B through one-way clutches 85A and 85B. The tape feeding reel 64, the tape take-up reel 65, the brake wheels 80A and 80B, the tape feeding gear 84A, and the tape take-up gear 84B are vertically movable in unison relative to the spline shaft 79. Rack gears 86A and 86B are disposed between the tape feeding gear 84A and the tape take-up gear 84B. The tape feeding gear 84A is in mesh with the rack gear 86A, while the tape take-up gear 84B is in mesh the rack gear 86B. The support member 62, the brake pad 81, and the rack gears 86A and 86B are secured to an installation base 87.

When the polishing head 50 is lowered in the retreat position, the pins 83 are brought into contact with the pin stoppers. At this time, the downward movements of the tape feeding reel 64, the tape take-up reel 65, the brake wheels 80A and 80B, the tape feeding gear 84A, and the tape take-up gear 84B, all of which are coupled to the pins 83, are stopped, while the support member 62, the brake pad 81, and the rack gears 86A and 86B continue to move downwardly. As a result, the spring 82 is compressed, and the brake pad 81 is separated from the brake wheels 80A and 80B, allowing the tape feeding reel 64 and the tape take-up reel 65 to rotate freely. As the rack gears 86A and 86B are lowered, the tape feeding gear 84A and the tape take-up gear 84B, which are in engagement with the rack gears 86A and 86B, rotate. The tape feeding reel 64 rotates together with the tape feeding gear 84A to thereby unreel or feed a new portion of the polishing tape 61 by a predetermined length. On the contrary, the tape take-up reel 65 does not rotate because of the one-way clutch 85B.

As the polishing head 50 is elevated, the spring 82 extends, and the rack gears 86A and 86B move upwardly to rotate the tape feeding gear 84A and the tape take-up gear 84B. The tape take-up reel 65 rotates together with the tape take-up gear 84B to take up the used polishing tape 61, while the tape feeding reel 64 does not rotate because of the one-way clutch 85A. Since the tape take-up gear 84B has a smaller diameter than that of the tape feeding gear 84A, the tape take-up reel 65 makes more revolutions than the tape feeding reel 64 does. A toque limiter 88 is incorporated in the tape take-up reel 65. This toque limiter 88 is configured to permit the tape take-up gear 84B to slip after the tape take-up reel 65 has wound the polishing tape 61 to thereby apply a tension to the polishing tape 61. When the brake pad 81 contacts the brake wheels 80A and 80B, the tape take-up reel 65 stops rotating, whereby the renewal of the polishing tape 61 is terminated.

Since the tape cartridge 60 in this example requires no motor for advancing the polishing tape 61, the structure of the polishing head 50 can be made simple. Furthermore, because the polishing tape 61 is advanced intermittently, the consumption of the polishing tape 61 can be reduced. As can be seen from in FIGS. 12 and 13, the tape cartridge 60 in this example has a symmetric structure, and each tape cartridge 60 has two polishing tapes 61. In this example, the adhesive force of the binder used for binding the abrasive grains to the polishing tape 61 is lower than that in the previous embodiment in which the polishing tape 61 is advanced. For example, a water-soluble binder may be used.

During polishing of the substrate W, the polishing tapes 61 are not advanced in their longitudinal direction, and the relative position of the polishing surfaces of the polishing tapes 61 and the polishing head 50 is fixed. When the polishing head 50 is at the retreated position shown in FIG. 4, the polishing tapes 61 are advanced in their longitudinal direction by a predetermined length from the tape feeding reels 64 to the tape take-up reels 65. In this embodiment, when the polishing tapes 61 are placed in contact with the substrate W, the abrasive grains are removed from the polishing tapes 61. These abrasive grains are brought into contact with fine protrusions on the substrate W while the polishing tapes 61 are pressed against the fine protrusions on the substrate W. As a result, the fine protrusions on the substrate W are scraped off and are removed from the substrate W.

Figure 18:
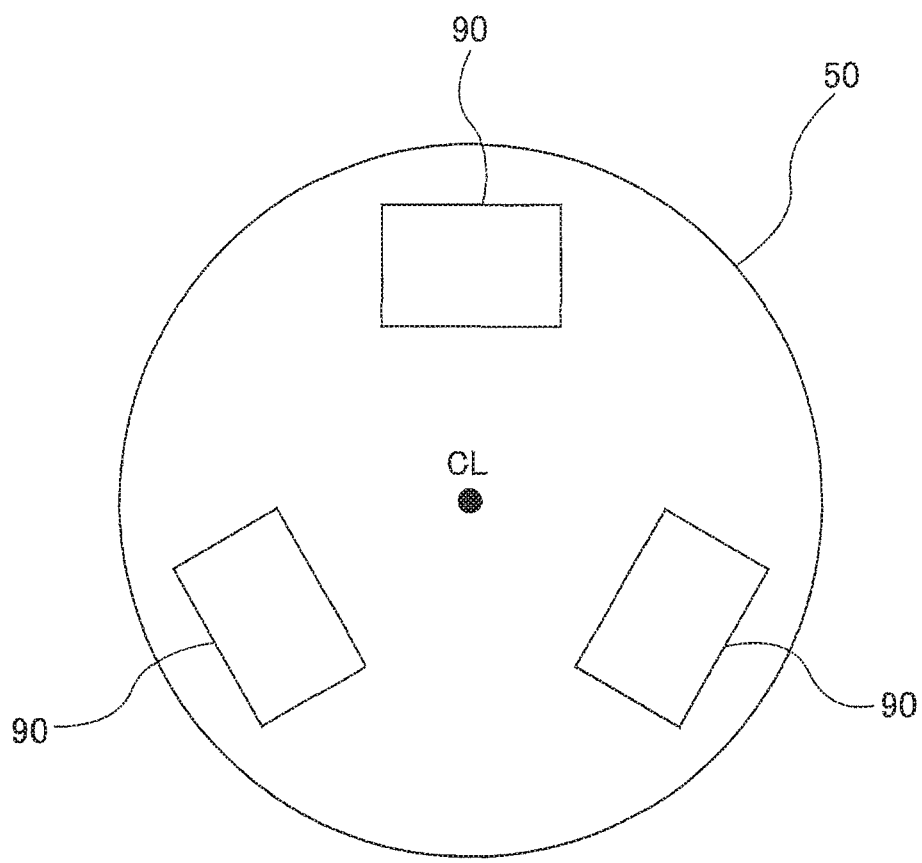
FIG. 18 is a bottom view of a polishing head including a polishing pad.

In one embodiment, instead of the polishing tapes 61, polishing pads having abrasive grains fixed thereto may be used as the polishing tools. For example, the polishing tools may be polishing pads each including a synthetic resin (e.g., polyvinyl alcohol or polyethylene), and abrasive grains fixed to one side of the synthetic resin by a binder. FIG. 18 is a bottom view of the polishing head 50 having such polishing pads. A plurality of polishing pads 90 are arranged at equal intervals around the central axis CL of the polishing head 50, as well as the polishing tapes 61 in the above-discussed embodiment. A bottom surface of each polishing pad 90 provides a polishing surface with the abrasive grains fixed thereto.

According to the above-described embodiments, the polishing head 50 includes the plurality of polishing tools (i.e., the polishing tapes 61 or the polishing pads 90), which polish the front-side surface of the substrate W while rotating around the central axis CL. Because the polishing head 50 has the plurality of the polishing tools, even if many fine protrusions exist on the substrate W, the rotating polishing tools (i.e., the polishing tapes 61 or the polishing pads 90) can efficiently remove these fine protrusions from the substrate W. Further, the plurality of polishing tools are rotated around the central axis CL which is perpendicular to the front-side surface of the substrate W, so that the polishing head 50 can remove the fine protrusions from the entirety of the front-side surface of the substrate W.

FIG. 19 is a plan view of a substrate processing system including the polishing apparatus 1 described above. This substrate processing system is a composite processing system capable of processing a plurality of substrates successively (i.e., polishing, cleaning, and drying a plurality of substrates). As shown in FIG. 19, the substrate processing system has a loading and unloading section 120 including four front loaders 121 on which substrate cassettes (wafer cassettes), each storing a number of substrates therein, are placed. Each of the front loaders 121 is capable of receiving thereon an open cassette, an SMIF (Standard Manufacturing Interface) pod, or a FOUP (Front Opening Unified Pod). The SMIF and FOUP are a hermetically sealed container which houses a substrate cassette therein and covers it with a partition wall to thereby provide interior environments isolated from an external space.

The loading and unloading section 120 further includes a first transfer robot (loader) 123 movable along the array of the front loaders 121. The first transfer robot 123 can selectively access the substrate cassettes installed on the front loaders 121 and can remove a substrate from the substrate cassettes. A particle counter 124 is disposed adjacent to the first transfer robot 123. This particle counter 124 is a device for counting the number of fine protrusions, i.e., particles, existing on the front-side surface of the substrate. The particle counter 124 may be omitted.

The substrate processing system further includes a plurality of polishing apparatuses 1 described above, a second transfer robot 126 disposed near the polishing apparatuses 1, and a first substrate station 131 and a second substrate station 132 on which a substrate is temporarily placed. In this embodiment, two polishing apparatuses 1 are arranged next to each other. In one embodiment, one polishing apparatus 1, or three or more polishing apparatuses 1 may be provided.

The substrate processing system further includes a cleaning unit 134 for cleaning a substrate that has been polished by the polishing apparatus 1, a drying unit 135 for drying the cleaned substrate, a third transfer robot 137 for transporting the substrate from the second substrate station 132 to the cleaning unit 134, a fourth transfer robot 138 for transporting the substrate from the cleaning unit 134 to the drying unit 135, and an operation controller 133 for controlling overall operations of the substrate processing system. In this embodiment, the cleaning unit 134 comprises a roll-sponge cleaning device having two roll sponges configured to contact the front-side surface and the back-side surface of the substrate, respectively, while the roll sponges are rotating. The drying unit 135 has nozzles configured to supply IPA vapor (a gaseous mixture of isopropyl alcohol and $N_2$ gas) and pure water, respectively, onto the front-side surface of the substrate, while moving the nozzles along the front-side surface of the substrate.

Operations of the substrate processing system are as follows. The first transfer robot 123 removes a substrate from the substrate cassette, and transports the substrate to the particle counter 124. The particle counter 124 counts the number of fine protrusions, such as particles, existing on the front-side surface of the substrate, and sends the number of fine protrusions to the operation controller 133. The operation controller 133 may change a polishing recipe in the polishing apparatus 1 based on the number of fine protrusions. For example, a polishing time of the substrate may be set longer if the number of fine protrusions exceeds a predetermined reference value.

The first transfer robot 123 removes the substrate from the particle counter 124, and then places the substrate on the first substrate station 131. The second transfer robot 126 removes the substrate from the first substrate station 131, and transports the substrate into either one of the two polishing apparatuses 1.

The polishing apparatus 1 polishes the front-side surface of the substrate according to the operation sequence described above. If necessary, secondary polishing may be performed on the polished substrate in the other polishing apparatus 1. The second transfer robot 126 transports the polished substrate from the polishing apparatus 1 to the second substrate station 132. The third transfer robot 137 transports the substrate from the second substrate station 132 to the cleaning unit 134. The cleaning unit 134 cleans the substrate by rubbing the roll sponges against the both surfaces of the substrate while supplying a liquid to the substrate, thereby cleaning the substrate.

The fourth transfer robot 138 transports the cleaned substrate from the cleaning unit 134 to the drying unit 135. This drying unit 135 supplies the IPA vapor and the pure water from the moving nozzles, respectively, thereby drying the substrate. The first transfer robot 123 removes the dried substrate from the drying unit 135, and returns the substrate to the substrate cassette. In this manner, polishing, cleaning, and drying of the substrate are performed.

In one embodiment, before the dried substrate is returned to the substrate cassette, the first transfer robot 123 may transport the dried substrate to the particle counter 124. The particle counter 124 counts the number of fine protrusions existing on the front-side surface of the substrate that has been polished by the polishing apparatus 1, and sends the number of fine protrusions to the operation controller 133. The operation controller 133 may change a polishing recipe for the next substrate to be polished in the polishing apparatus 1 based on the number of fine protrusions. For example, a polishing time of the next substrate may be set longer if the number of fine protrusions exceeds a predetermined reference value.

The above-discussed substrate processing system can selectively perform a serial polishing in which one substrate is polished by the plurality of polishing apparatuses 1 sequentially, a parallel process in which a plurality of substrates are polished in parallel by the polishing apparatuses 1, respectively, and a combination of the serial polishing and the parallel polishing in which each of substrates is polished by the plurality of polishing apparatuses 1 sequentially, while the substrates are polished by the plurality of polishing apparatuses 1 simultaneously. One of the two polishing apparatuses 1 may use cleaning tapes having no abrasive grains, instead of the polishing tapes. In this case, one of the two polishing apparatuses 1 can polish a substrate with the polishing tapes, and then the other of the two polishing apparatuses 1 can clean the substrate with the cleaning tapes.

Figure 20:
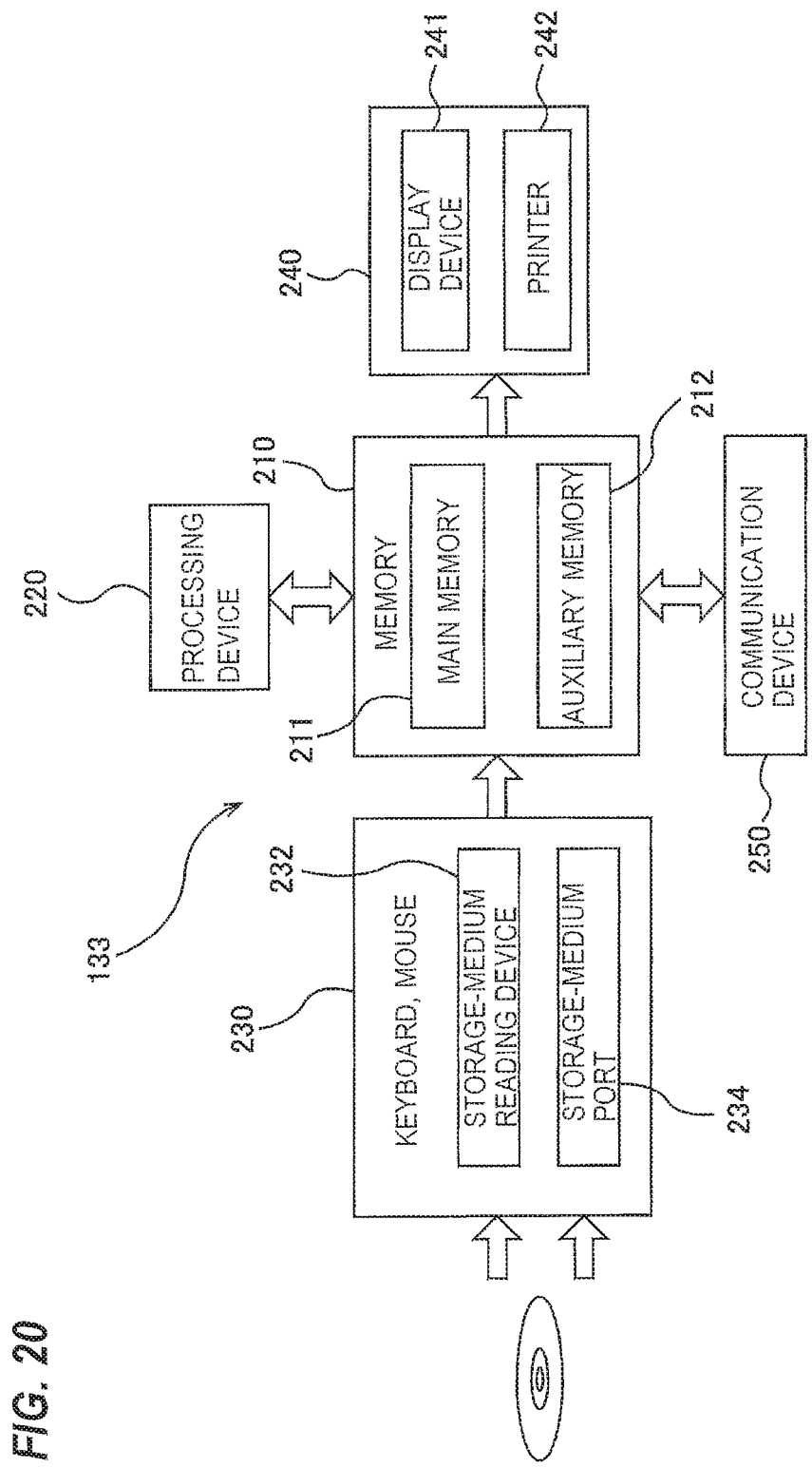
FIG. 20 is a schematic view showing an example of a configuration of an operation controller.

The operations of the substrate processing system including the polishing apparatuses 1 and the particle counter 124 are controlled by the operation controller 133. In this embodiment, the operation controller 133 is constituted by a dedicated computer or a general-purpose computer. FIG. 20 is a schematic view showing an example of a structure of the operation controller 133. The operation controller 133 includes a memory 210 in which a program and data are stored, a processing device 220, such as CPU (central processing unit), for performing arithmetic operation according to the program stored in the memory 210, an input device 230 for inputting the data, the program, and various information into the memory 210, an output device 240 for outputting processing results and processed data, and a communication device 250 for connecting to a network, such as the Internet.

The memory 210 includes a main memory 211 which is accessible by the processing device 220, and an auxiliary memory 212 that stores the data and the program therein. The main memory 211 may be a random-access memory (RAM), and the auxiliary memory 212 is a storage device which may be a hard disk drive (HDD) or a solid-state drive (SSD).

The input device 230 includes a keyboard and a mouse, and further includes a storage-medium reading device 232 for reading the data from a storage medium, and a storage-medium port 234 to which a storage medium can be connected. The storage medium is a non-transitory tangible computer-readable storage medium. Examples of the storage medium include optical disk (e.g., CD-ROM, DVD-ROM) and semiconductor memory (e.g., USB flash drive, memory card). Examples of the storage-medium reading device 232 include optical disk drive (e.g., CD drive, DVD drive) and card reader. Examples of the storage-medium port 234 include USB terminal. The program and/or the data stored in the storage medium is introduced into the operation controller 133 via the input device 230, and is stored in the auxiliary memory 212. The output device 240 includes a display device 241 and a printer 242. The printer 242 may be omitted.

The operation controller 133 operates according to the program electrically stored in the memory 210. Specifically, the operation controller 133 performs the steps of: instructing the substrate rotating mechanism 10 to hold the back-side surface of the substrate and rotate the substrate; instructing the head motor M1, coupled to the polishing head 50, to rotate the polishing tools (e.g., the polishing tapes 61 or the polishing pads 90) attached to the polishing head 50; and instructing the actuator 57, coupled to the polishing head 50, to exert the downward load on the polishing head 50 to press the polishing tools against the front-side surface of the substrate on which interconnect patterns are to be formed. The program for causing the operation controller 133 to perform these steps is stored in a non-transitory tangible computer-readable storage medium. The operation controller 133 is provided with the program via the storage medium. The operation controller 133 may be provided with the program via communication network, such as the Internet.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A polishing method comprising:
    rotating a substrate while holding a back-side surface of the substrate with a vacuum suction stage;
    rotating a polishing head holding a plurality of polishing tools; and
    polishing a front-side surface of the substrate by pressing the plurality of polishing tools, which are rotating, against the front-side surface of the substrate while directing a liquid to a target area of the front-side surface, with the liquid in approximately parallel to the front-side surface of the substrate, the target area being located upstream of the polishing head with respect to a rotating direction of the substrate, the front-side surface being a surface on which interconnect patterns are to be formed.

2. The polishing method according to claim 1, wherein pressing the plurality of polishing tools, which are rotating, against the front-side surface of the substrate comprises pressing the plurality of polishing tools, which are rotating, against the front-side surface of the substrate while oscillating the polishing head parallel to the front-side surface of the substrate.

3. The polishing method according to claim 2, wherein oscillating the polishing head parallel to the front-side surface of the substrate comprises oscillating the polishing head between a central portion and an outer portion of the front-side surface of the substrate in directions parallel to the front-side surface of the substrate.

4. The polishing method according to claim 1, wherein the liquid contains no abrasive grains therein.

5. The polishing method according to claim 1, wherein pressing the plurality of polishing tools, which are rotating, against the front-side surface of the substrate comprises pressing the plurality of polishing tools, which are rotating, against the front-side surface of the substrate while advancing the plurality of the polishing tools in their longitudinal direction.

6. The polishing method according to claim 1, wherein pressing the plurality of polishing tools, which are rotating, against the front-side surface of the substrate comprises pressing the plurality of polishing tools, which are rotating, against the front-side surface of the substrate without advancing the plurality of the polishing tools in their longitudinal direction.

7. The polishing method according to claim 1, wherein the plurality of polishing tools are a plurality of polishing tapes each having a polishing surface formed of a polishing layer containing abrasive grains.

8. The polishing method according to claim 1, wherein a flow velocity of the liquid is in a range of 1 m/second to 10 m/second.

9. The polishing method according to claim 1, wherein the liquid is directed toward the at least one of the plurality of polishing tools from a liquid supply nozzle which is being swung horizontally relative to the substrate.

10. The polishing method according to claim 1, further comprising:
detecting a state of the front-side surface of the substrate by a state detection sensor during polishing of the front-side surface of the substrate, the state of the front-side surface being at least one of a film thickness, the number of fine protrusions existing on the front-side surface, and a surface roughness.

11. The polishing method according to claim 1, wherein the vacuum suction stage has a holding surface having substantially a same size as the substrate.

12. A polishing method comprising:
preparing a substrate having a front-side surface on which interconnect patterns are to be formed and a back-side surface on which no interconnect patterns are to be formed;
rotating the substrate while holding the back-side surface of the substrate with a vacuum suction stage;
rotating a polishing head holding a plurality of polishing tools; and
polishing the front-side surface of the substrate by pressing the plurality of polishing tools, which are rotating, against the front-side surface of the substrate while oscillating the polishing head parallel to the front-side surface of the substrate and while directing a liquid to a target area of the front-side surface, with the liquid in approximately parallel to the front-side surface of the substrate, the target area being located upstream of the polishing head with respect to a rotating direction of the substrate.

13. A polishing apparatus comprising:
a vacuum suction stage having a holding surface configured to hold a back-side surface of a substrate;
a stage motor configured to rotate the vacuum suction stage;
a polishing head;
a plurality of polishing tools attached to the polishing head;
a liquid supply nozzle configured to supply a liquid, the liquid supply nozzle being oriented toward a position upstream of the polishing head with respect to a rotating direction of the vacuum suction stage, the liquid supply nozzle having an ejection orifice disposed in a direction approximately parallel to the holding surface;
a head motor configured to rotate the polishing head and the plurality of polishing tools; and
an actuator configured to exert a downward load on the polishing head to cause the polishing head to press the plurality of polishing tools against a front-side surface of the substrate.

14. The polishing apparatus according to claim 13, further comprising:
an oscillating mechanism configured to oscillate the polishing head parallel to the holding surface of the vacuum suction stage.

15. The polishing apparatus according to claim 13, further comprising:
a state detection sensor configured to detect a state of the front-side surface of the substrate, the state detection sensor being arranged above the vacuum suction stage.

16. The polishing apparatus according to claim 13, wherein the holding surface has substantially a same size as the substrate.

17. A substrate processing system for processing substrates successively, comprising:
a polishing apparatus;
a particle counter configured to count the number of fine protrusions existing on a front-side surface of a substrate that has been polished by the polishing apparatus;
an operation controller configured to receive the number of fine protrusions and change a polishing recipe for polishing a next substrate in the polishing apparatus,
wherein the polishing apparatus includes:
a vacuum suction stage having a holding surface configured to hold a back-side surface of the substrate;
a stage motor configured to rotate the vacuum suction stage;
a polishing head;
a plurality of polishing tools attached to the polishing head;
a liquid supply nozzle configured to supply a liquid, the liquid supply nozzle being oriented toward a position upstream of the polishing head with respect to a rotating direction of the vacuum suction stage, the liquid supply nozzle having an ejection orifice disposed approximately parallel to the holding surface;
a head motor configured to rotate the polishing head and the plurality of polishing tools; and
an actuator configured to exert a downward load on the polishing head to enable the polishing head to press the plurality of polishing tools against the front-side surface of the substrate.

* * * * *